(12) United States Patent
Watanabe et al.

(10) Patent No.: US 11,390,305 B2
(45) Date of Patent: Jul. 19, 2022

(54) UNDERFLOOR DEVICE OF RAILWAY VEHICLE

(71) Applicant: Mitsubishi Electric Corporation, Tokyo (JP)

(72) Inventors: Tomoki Watanabe, Tokyo (JP); Shunsuke Okada, Tokyo (JP); Takayuki Kawaguchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 372 days.

(21) Appl. No.: 16/475,219

(22) PCT Filed: Mar. 9, 2017

(86) PCT No.: PCT/JP2017/009562
§ 371 (c)(1),
(2) Date: Jul. 1, 2019

(87) PCT Pub. No.: WO2018/163372
PCT Pub. Date: Sep. 13, 2018

(65) Prior Publication Data
US 2019/0382036 A1    Dec. 19, 2019

(51) Int. Cl.
*B61C 17/06* (2006.01)
*H05K 5/02* (2006.01)

(52) U.S. Cl.
CPC .............. *B61C 17/06* (2013.01); *H05K 5/02* (2013.01); *H05K 5/0204* (2013.01)

(58) Field of Classification Search
CPC .......... B61C 17/00; B61C 17/06; H02K 5/02; H02K 5/0204
See application file for complete search history.

(56) References Cited

FOREIGN PATENT DOCUMENTS

| CN | 202243465 U | * | 5/2012 | ............. B61C 17/00 |
|---|---|---|---|---|
| CN | 202243465 U | | 5/2012 | |
| CN | 205801104 U | | 12/2016 | |
| JP | H01315192 A | | 12/1989 | |
| JP | H09263239 A | | 10/1997 | |

(Continued)

OTHER PUBLICATIONS

Office Action dated Jun. 3, 2020, issued in corresponding Chinese Patent Application No. 201780087585.7, 14 pages including 7 pages of English translation.

(Continued)

*Primary Examiner* — Robert J McCarry, Jr.
(74) *Attorney, Agent, or Firm* — Buchanan Ingersoll & Rooney PC

(57) ABSTRACT

Locking members disposed on a casing of an underfloor device for railway vehicles engage hanging tools disposed on the vehicle, whereby the underfloor device for railway vehicles is attached to the vehicle. The locking member is a hollow locking member that includes a locking part to contact and engage a vertically upper face of part of the hanging tool, a mount part attached to the casing, and a connection part connecting the locking part and the mount part. The locking part is disposed at a position spaced apart from the casing horizontally and vertically upward. The locking part contacts and engages the vertically upper face of part of the hanging tool inserted into a space surrounded by the locking part, the mount part, and the connection part.

16 Claims, 15 Drawing Sheets

(56) References Cited

FOREIGN PATENT DOCUMENTS

| | | | |
|---|---|---|---|
| JP | 2004299469 A | 10/2004 | |
| JP | 2016124459 A | 7/2016 | |

OTHER PUBLICATIONS

International Search Report (PCT/ISA/210) dated Apr. 25, 2017, by the Japan Patent Office as the International Searching Authority for International Application No. PCT/JP2017/009562.

Office Action dated Jan. 14, 2021 issued in corresponding Chinese Patent Application No. 201780087585.7, with English translation (13 pages).

Office Action dated Oct. 15, 2020, issued in corresponding Indian Patent Application No. 201947033440, 5 pages.

\* cited by examiner

UNDERFLOOR DEVICE OF RAILWAY VEHICLE

TECHNICAL FIELD

The present disclosure relates to an underfloor device for railway vehicles installed under a floor of a railway vehicle.

BACKGROUND ART

To install an underfloor device in a vehicle, a locking member disposed on the underfloor device is fastened to a hanging tool disposed on the vehicle body, whereby the underfloor device is fixed to the vehicle. If the locking member of the underfloor device is fastened to the hanging tool with a bolt for fastening the hanging tool and the locking member together that is under load, the underfloor device will drop from the vehicle when the bolt is broken.

Thus, some inventions disclose configurations in which the bolt fastening the hanging tool and the locking member together is under no load. An underfloor device for railway vehicles disclosed in Patent Literature 1 has a safety hanging configuration in which a hanging lug disposed on the underfloor device for railway vehicles is placed on an upper face of a hanging frame disposed on the vehicle body side. In a power supply box for railway vehicles disclosed in Patent Literature 2, mounting plates welded to an upper end of the power supply box are inserted into a pair of L-shaped suspended frames disposed under a vehicle floor and extending in the crosstie direction, and fastened with bolts from the underside. In an apparatus box disclosed in Patent Literature 3, an apparatus box hanging plate faces a hanging plate on the vehicle body side, the hanging plates sandwich an insulating washer therebetween, and the apparatus box hanging plate is supported by the insulating washer.

CITATION LIST

Patent Literature

Patent Literature 1: Unexamined Japanese Patent Application Kokai Publication No. 2004-299469
Patent Literature 2: Unexamined Japanese Patent Application Kokai Publication No. H9-263239
Patent Literature 3: Unexamined Japanese Patent Application Kokai Publication No. H1-315192

SUMMARY OF INVENTION

Technical Problem

To install the underfloor device for railway vehicles disclosed in Patent Literature 1, the underfloor device is moved to the underside of a vehicle floor from a lateral side of the vehicle, lifted vertically upward, and slid in the vehicle traveling direction, and then the hanging lug disposed on the underfloor device is placed on the hanging frame. In the case of using a lifter that itself is allowed to move back and forth only and has a platform that is allowed to move vertically only, to install the underfloor device for railway vehicles disclosed in Patent Literature 1, the underfloor device is, after being lifted vertically upward by using the lifter, to be slid in the vehicle traveling direction without using the lifter, and thus the installation work is troublesome.

The power supply box for railway vehicles disclosed in Patent Literature 2 is supported by the suspended frames positioned at both ends of the power supply box with respect to the vehicle traveling direction and extending in the crosstie direction. Strength required for the suspended frame increases with increased length of the power supply box in the vehicle traveling direction. Since there is a limit to the strength of the suspended frame, a limitation is imposed on the dimensions of the power supply box.

The apparatus box hanging plate disclosed in Patent Literature 3 is attached to an upper face of the apparatus box. Depending on the vertical lengths of the hanging plate on the vehicle body side, the insulating washer, and the apparatus box hanging plate, and on a space needed for work of attaching the hanging plate on the vehicle body side and the apparatus box hanging plate to the insulating washer, a limitation is imposed on the dimensions of the apparatus box.

In consideration of the foregoing circumstances, an objective of the present disclosure is to make the work of attaching an underfloor device easier without imposing a limitation on the dimensions of the underfloor device.

Solution to Problem

To achieve the aforementioned objective, an underfloor device for a railway vehicle of the present disclosure includes a casing and locking members. The underfloor device for the railway vehicle is attachable to and removable from an attachment opening under a floor of the vehicle, and is attached to the vehicle by being supported by hanging tools disposed under the floor of the vehicle. The locking members are attached to the casing, and each of the locking members engages a corresponding hanging tool of the hanging tools. At least one of the locking members is a hollow locking member including a locking part to contact and engage a vertically upper face of part of the hanging tool, a mount part that is attached to the casing, and a connection part that connects the locking part and the mount part, and a space surrounded by the locking part, the mount part, and the connection part is formed. The locking part is disposed at a position spaced apart from the casing horizontally and vertically upward. The locking part contacts and engages the vertically upper face of part of the hanging tool inserted into the space. A void having a vertical length greater than or equal to a threshold value is disposed vertically under the locking part.

Advantageous Effects of Invention

According to the present disclosure, the locking part included in the hollow locking member is disposed at a position spaced apart from the casing horizontally and vertically upward, and the locking part contacts and engages the vertically upper face of part of the hanging tool inserted into the space in the hollow locking part, and consequently, the work of attaching the underfloor device can be simplified without imposing a limitation on the dimensions of the underfloor device.

DESCRIPTION OF EMBODIMENTS

Embodiments of the present disclosure are described in detail with reference to the drawings. Identical reference symbols are given to identical or equivalent parts throughout the drawings.

Figure 1:
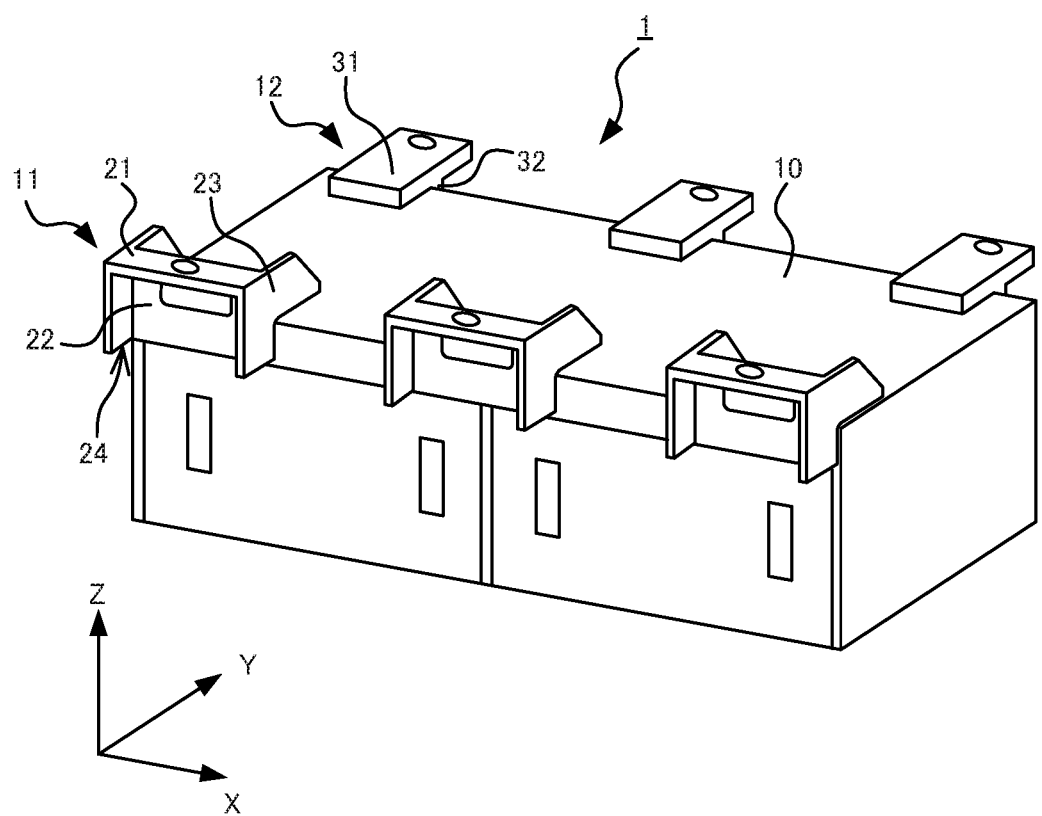
FIG. 1 is a perspective view of an underfloor device for railway vehicles according to an embodiment of the present disclosure.
Figure 2:
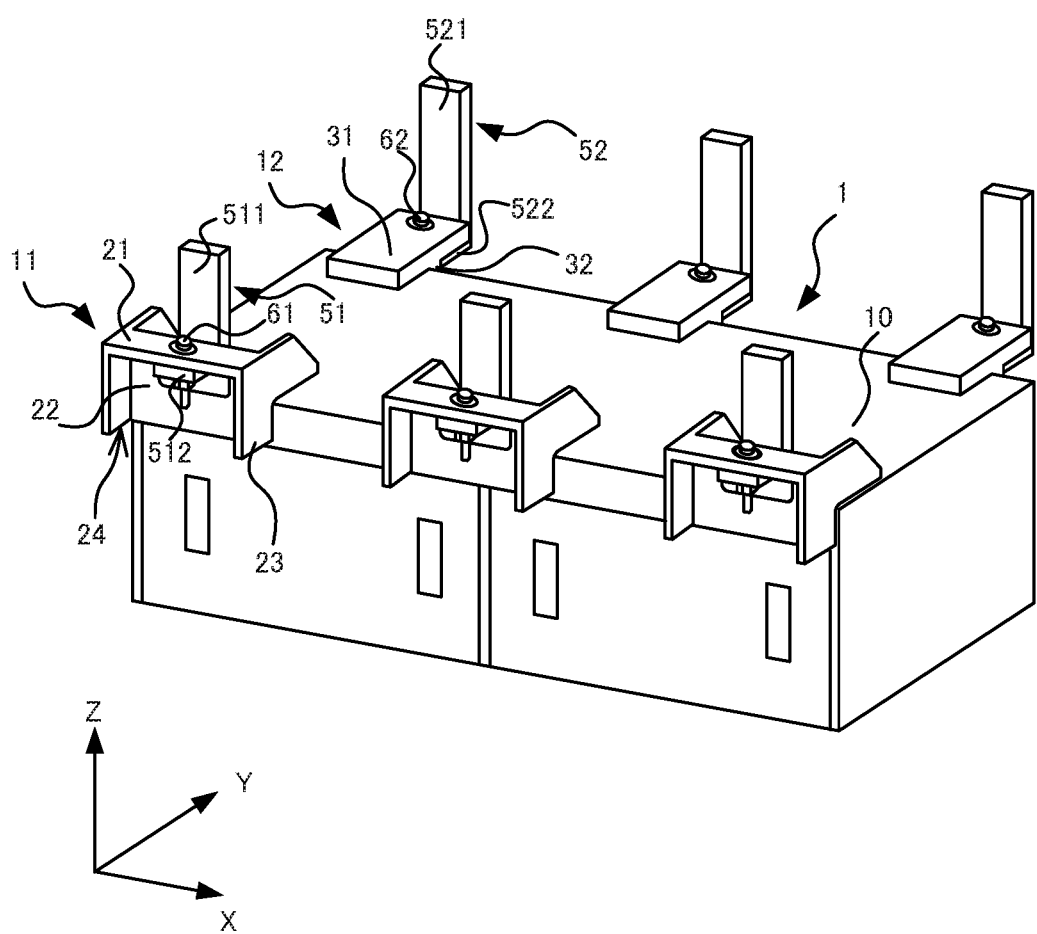
FIG. 2 illustrates an example of the attached underfloor device for railway vehicles according to the embodiment.

FIG. 1 is a perspective view of an underfloor device for railway vehicles according to an embodiment of the present disclosure. The underfloor device for railway vehicles (hereinafter called the "underfloor device") 1 is attached to a vehicle by being supported by a plurality of hanging tools disposed on the vehicle. The underfloor device 1 is attachable to and removable from an attachment opening under a vehicle floor, which is described later. The underfloor device 1 includes a casing 10 and a plurality of locking members 11, 12 each attached to the casing 10 and engaging a corresponding hanging tool of the hanging tools. Any number of locking members 11, 12 may be used. FIG. 2 illustrates an example of the attached underfloor device for railway vehicles according to an embodiment. The locking member 11 engages a hanging tool 51 and is fastened with a fastening member 61. The hanging tool 51 includes a leg 511 having one end attached to the vehicle body and extending vertically, and a foot 512 extending horizontally from the leg 511. The locking member 11 engages the foot 512, which is part of the hanging tool 51. The locking member 12 engages a hanging tool 52 and is fastened with a fastening member 62. The hanging tool 52 includes a leg 521 having one end attached to the vehicle body and extending vertically, and a foot 522 extending horizontally from the leg 521. The locking member 12 engages the foot 522, which is part of the hanging tool 52. The Z-axis corresponds to the vertical direction, the Y-axis corresponds to an attachment and removal direction of the underfloor device 1, and the X-axis corresponds to the direction orthogonal to the Y-axis and to the Z-axis. The Y-axis may correspond to the vehicle width direction or to the vehicle traveling direction.

Figure 3:
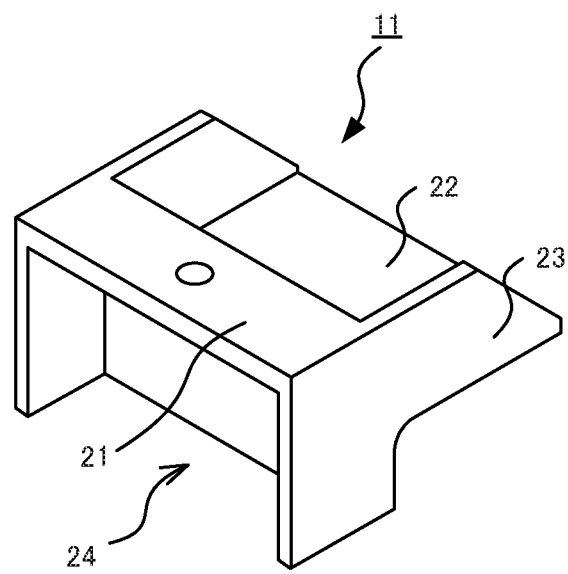
FIG. 3 is a perspective view of a locking member according to the embodiment.
Figure 4:
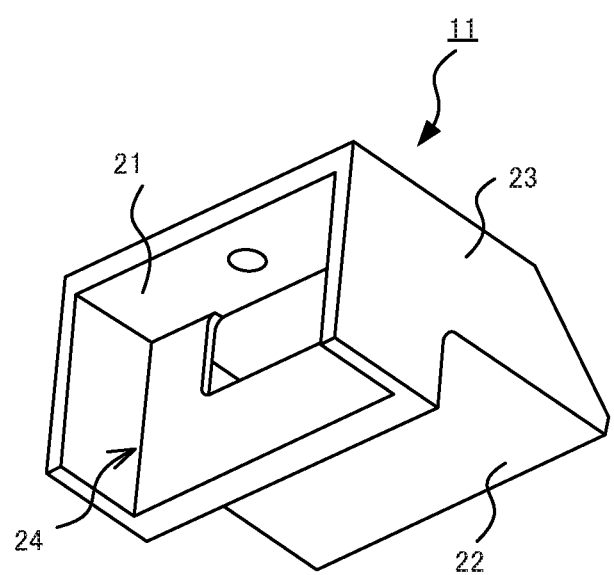
FIG. 4 is a perspective view of the locking member according to the embodiment.

FIGS. 3 and 4 are perspective views of the locking member according to the embodiment. FIG. 3 is a perspective view from above, and FIG. 4 is a perspective view from below. The locking member 11 is a hollow locking member that includes a locking part 21 to contact and engage a vertically upper face of the foot 512, which is part of the hanging tool 51, a mount part 22 attached to the casing 10, and a connection part 23 connecting the locking part 21 and the mount part 22. The locking member 11 includes a space surrounded by the locking part 21, the mount part 22, and the connection part 23. In the embodiment, the space is a space passing through the hollow locking member in the attachment and removal direction of the underfloor device 1. The locking part 21 is disposed at a position spaced apart from the casing 10 horizontally and vertically upward. The locking part 21 contacts and engages the vertically upper face of the foot 512, which is inserted into the space surrounded by the locking part 21, the mount part 22, and the connection part 23. A void 24 having a vertical length greater than or equal to a threshold value is disposed vertically under the locking part 21. The threshold value is determined on the basis of the space needed for work of fastening the locking member 11 to the hanging tool 51. The locking part 21 is disposed at a position spaced apart from the casing 10 horizontally and vertically upward, and the void 24 is disposed vertically under the locking part 21. Thus, there is no need to secure a space vertically over the casing 10 for work of attaching the underfloor device 1. Therefore, no limitation is imposed on the dimensions of the underfloor device 1.

Figure 5:
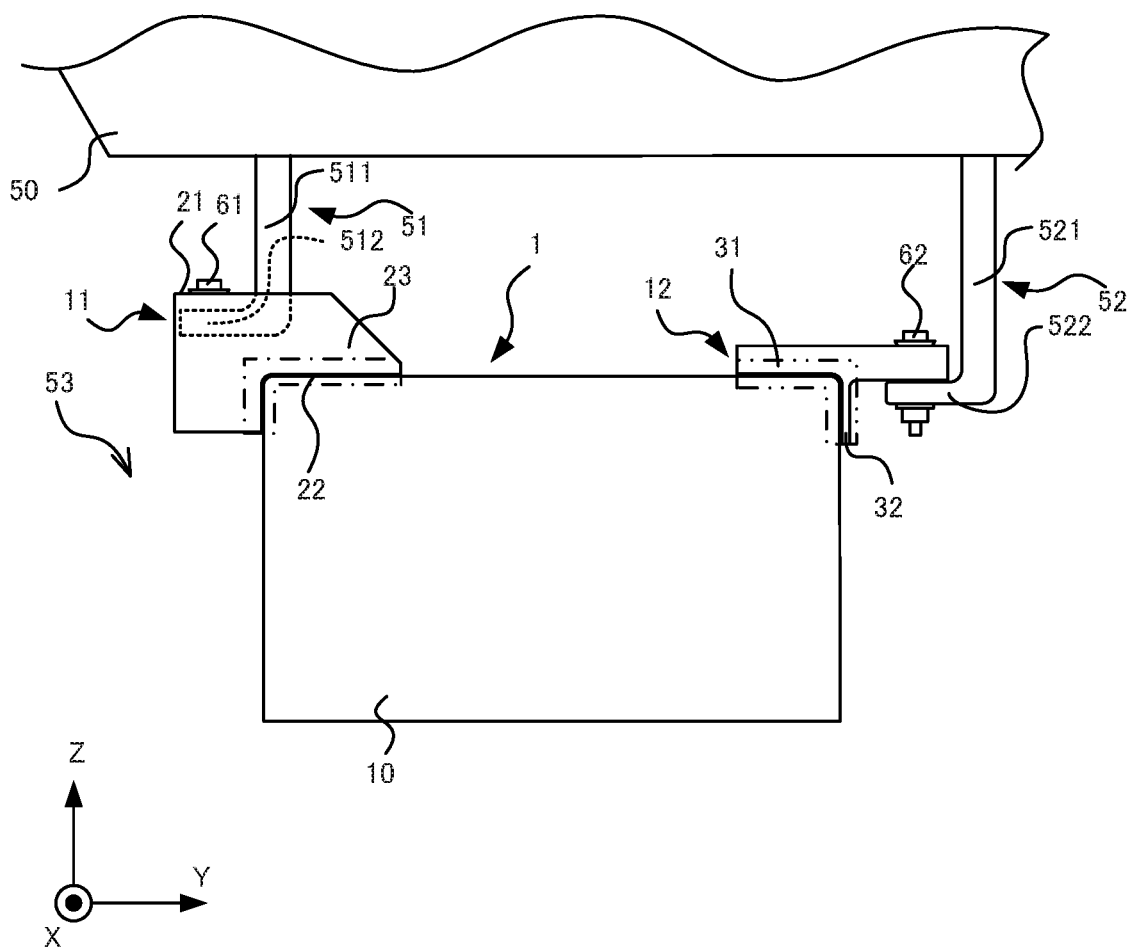
FIG. 5 is a side view of the underfloor device for railway vehicles according to the embodiment.
Figure 6:
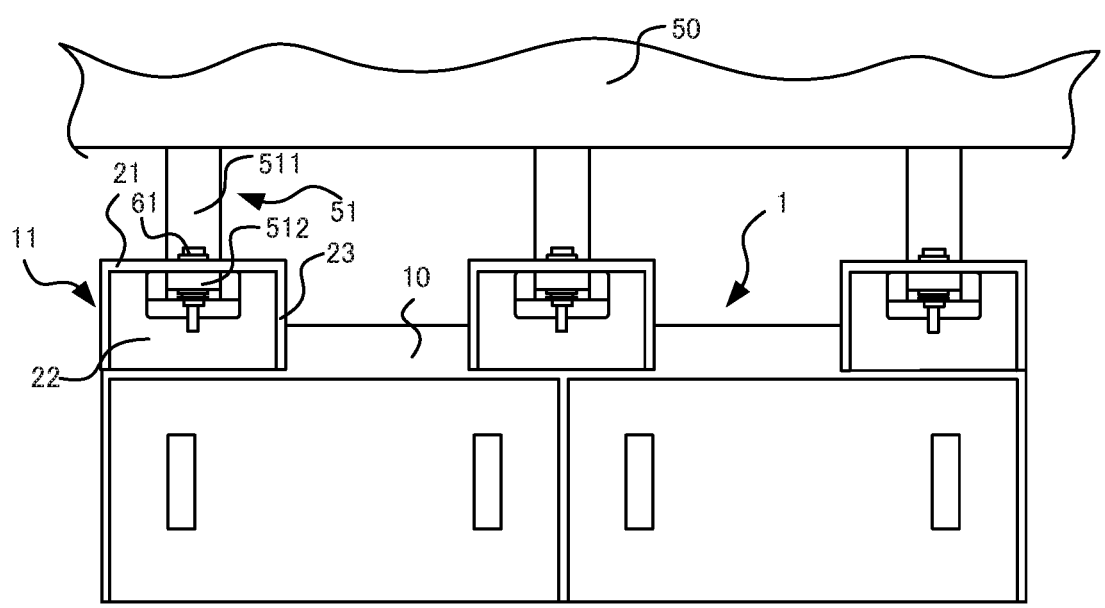
FIG. 6 is a front view of the underfloor device for railway vehicles according to the embodiment.
Figure 6:
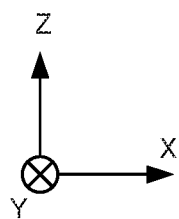

FIG. 5 is a side view of the underfloor device for railway vehicles according to the embodiment. FIG. 6 is a front view of the underfloor device for railway vehicles according to the embodiment. The leg 511 of the hanging tool 51 and the leg 521 of the hanging tool 52 are attached to a vehicle body 50. The leg 511 is shorter than the leg 521 in vertical length. The underfloor device 1 is attachable to and removable from an attachment opening 53 under the vehicle floor. In the embodiment, the underfloor device 1 is attached to and removed from the attachment opening 53, which is on a lateral side of the underfloor space of the vehicle. In the embodiment, the locking members 11, 12 are attached to a vertically upper face of the casing 10. The locking members 11, 12 are disposed at predetermined intervals along the two edges of the casing 10 opposed in the attachment and removal direction of the underfloor device 1. The interval between the locking members 11 and the interval between the locking members 12 are determined on the basis of factors including the weight of the underfloor device 1, strength of the locking members 11, 12, and strength of the hanging tools 51, 52. The mount part 22 of the locking member 11 abuts on the vertically upper face of the casing 10 and on the lateral face thereof, and is attached to the casing 10 by means of fastening with a fastening member (not illustrated), welding, or the like provided within a region indicated by a dashed-dotted line in FIG. 5.

In the embodiment, the locking members 11 are attached to the vertically upper face of the casing 10. The locking members 11 are disposed along one edge of the two edges of the casing 10 opposed in the attachment and removal direction of the underfloor device 1 (Y-axis), the one edge being closer to the attachment opening 53 in the state where the underfloor device 1 is attached to the vehicle body 50. The locking members 12 are attached to the casing 10 so as to be disposed along the other edge of the two edges of the casing 10. Each of the locking members 12 includes a horizontal member 31 extending horizontally and a vertical member 32 extending vertically from the horizontal member 31. One end of the horizontal member 31 contacts and engages a vertically upper face of the foot 522, which is part of the hanging tool 52. The other end of the horizontal member 31 and the vertical member 32 are attached to the casing 10. The other end of the horizontal member 31 and the vertical member 32, as indicated by a surrounding two-dot chain line in FIG. 5, are attached to the casing 10 by means of fastening with a fastening member (not illustrated), welding, or the like.

Figure 7:
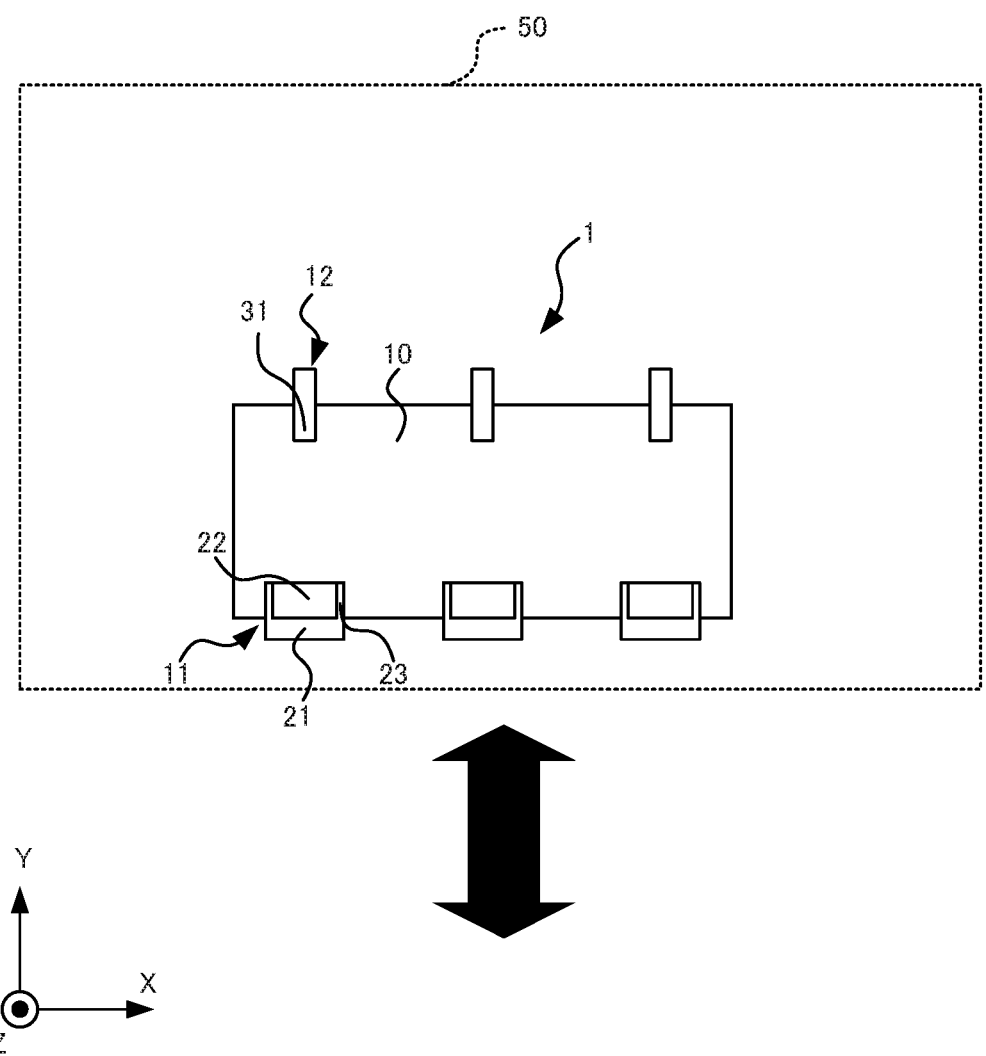
FIG. 7 is a top view of the underfloor device for railway vehicles according to the embodiment.

FIG. 7 is a top view of the underfloor device for railway vehicles according to the embodiment. The underfloor device 1 is attachable and removable along the attachment and removal direction of the underfloor device 1 indicated by the solid arrow in FIG. 7.

Figure 8:
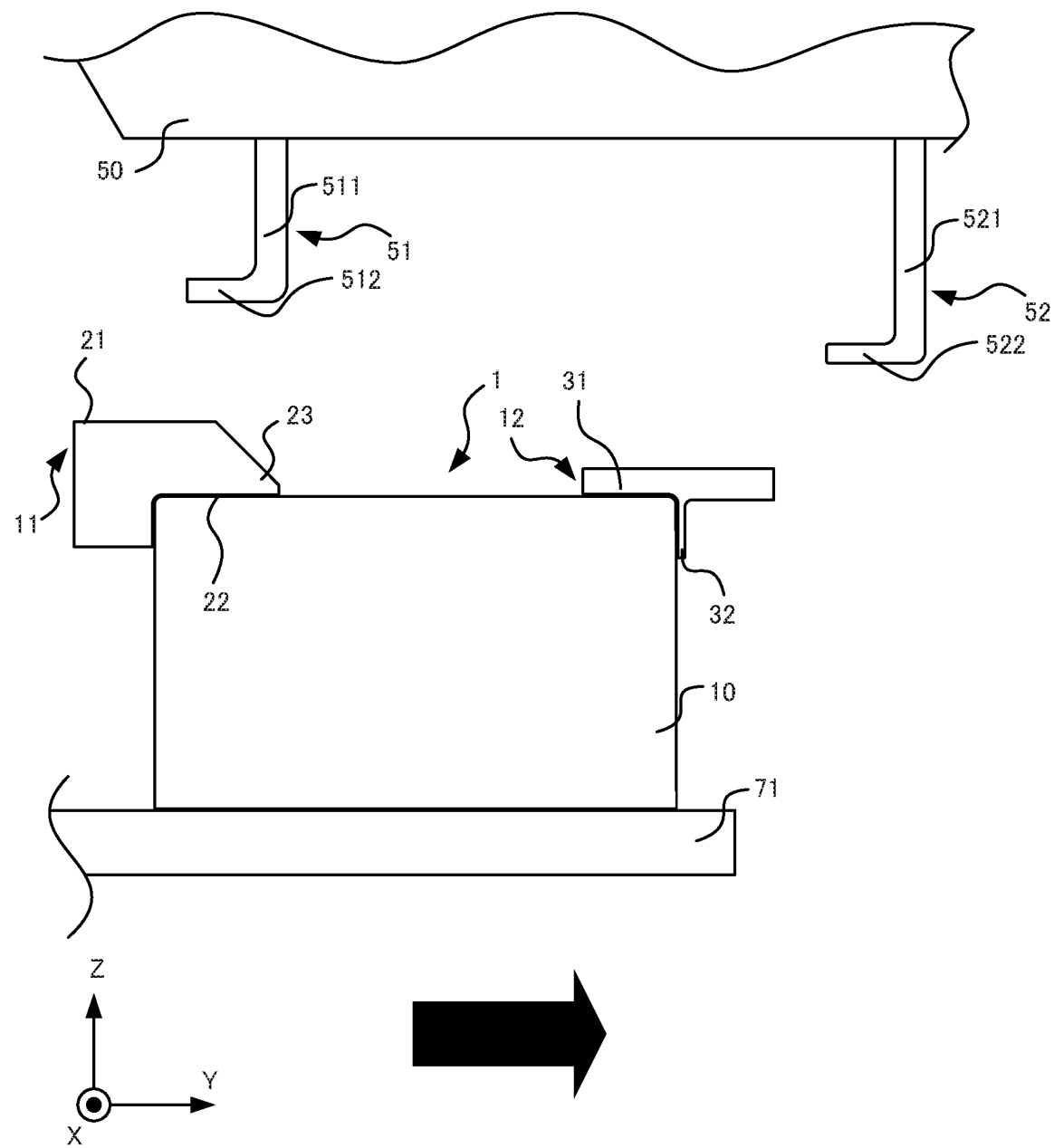
FIG. 8 illustrates an example of work of attaching the underfloor device for railway vehicles according to the embodiment.
Figure 9:
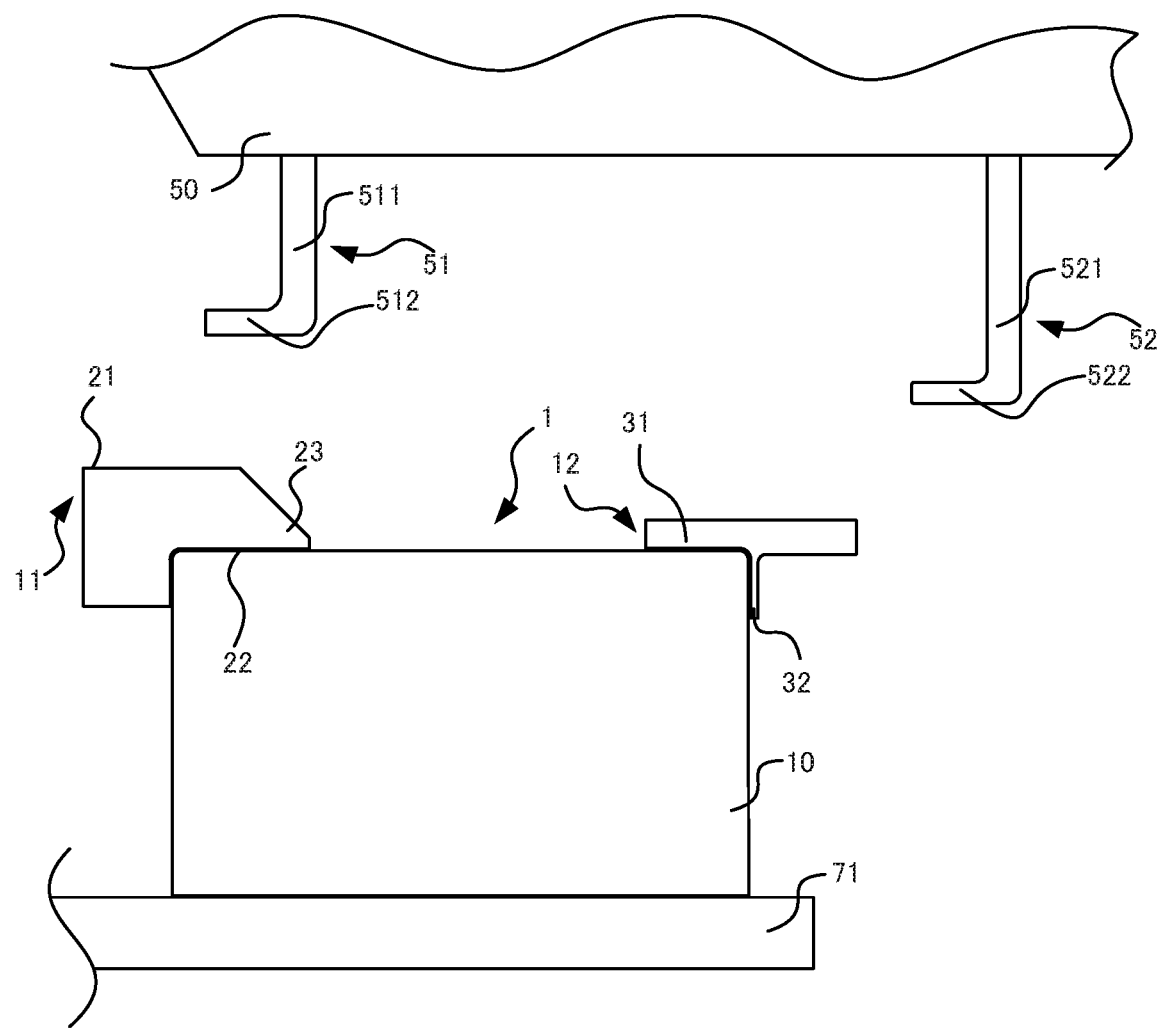
FIG. 9 illustrates an example of the work of attaching the underfloor device for railway vehicles according to the embodiment.
Figure 10:
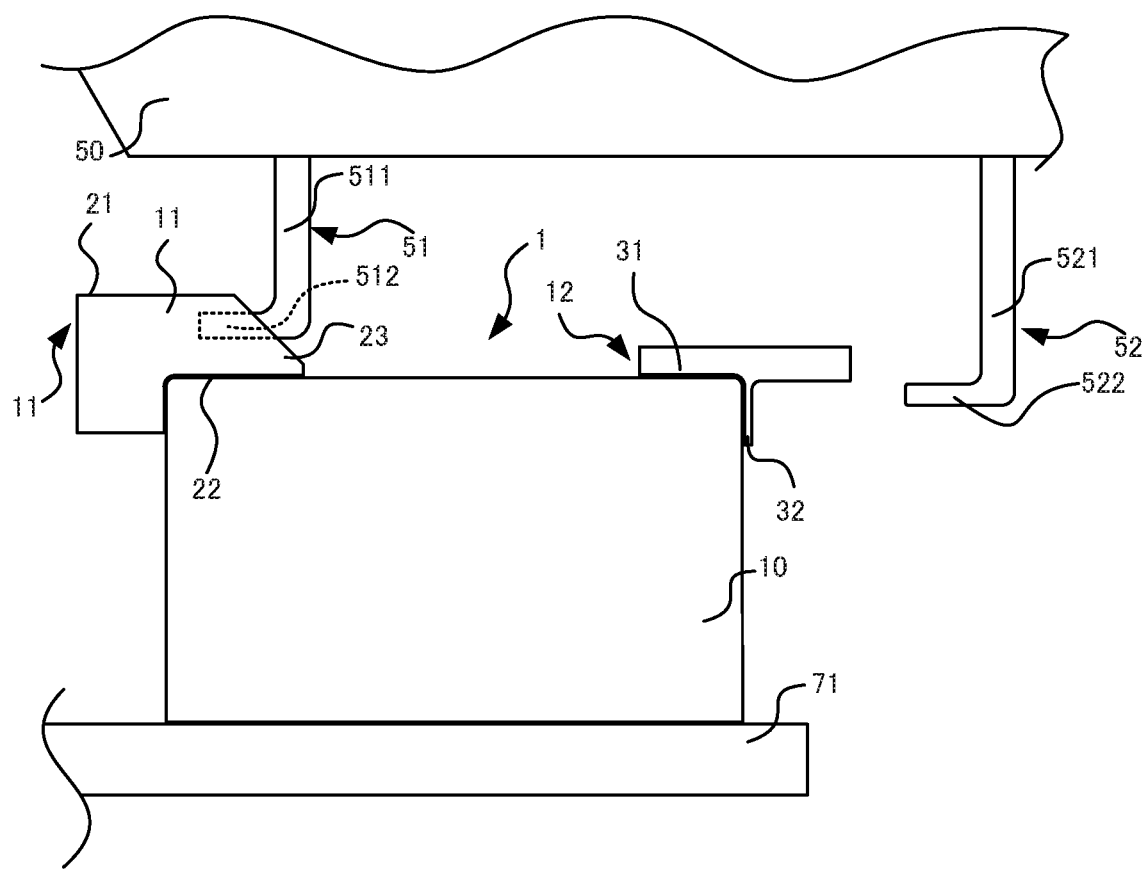
FIG. 10 illustrates an example of the work of attaching the underfloor device for railway vehicles according to the embodiment.
Figure 10:

FIGS. 8 to 10 illustrate an example of work of attaching the underfloor device for railway vehicles according to the embodiment. The underfloor device 1 is placed on a platform 71 of a lifter. As the lifter moves in the horizontal direction indicated by the black arrow in FIG. 8, the underfloor device 1 arrives at the position illustrated in FIG. 9. Upon arrival at the position illustrated in FIG. 9, the lifter stops. As the platform 71 moves vertically upward as indicated by the black arrow in FIG. 9, the underfloor device 1 arrives at the position illustrated in FIG. 10. Then, as the lifter moves in the horizontal direction indicated by the black arrow in FIG. 10, the underfloor device 1 arrives at the position illustrated in FIG. 5. The locking member 11 and the foot 512 are fastened together, and the locking member 12 and the foot 522 are fastened together, thereby attaching the underfloor device 1 to the vehicle body 50.

As illustrated in FIGS. 8 to 10, to install the underfloor device 1, front-back movement of the lifter is sufficient, and lateral movement is not required. The underfloor device 1 may be moved along the attachment and removal direction and along the vertical direction only of the underfloor device 1. Thus, the work of attaching the underfloor device 1 is easier than lifting the device vertically and then moving the device in a direction orthogonal to the traveling direction of the lifter. The underfloor device 1 can be removed by following the installation steps described above in reverse order. As with installing the underfloor device 1, to remove the underfloor device 1, front-back movement of the lifter is sufficient, and lateral movement is not required. As with the foregoing, the work of removing the underfloor device 1 is easy.

Figure 11:
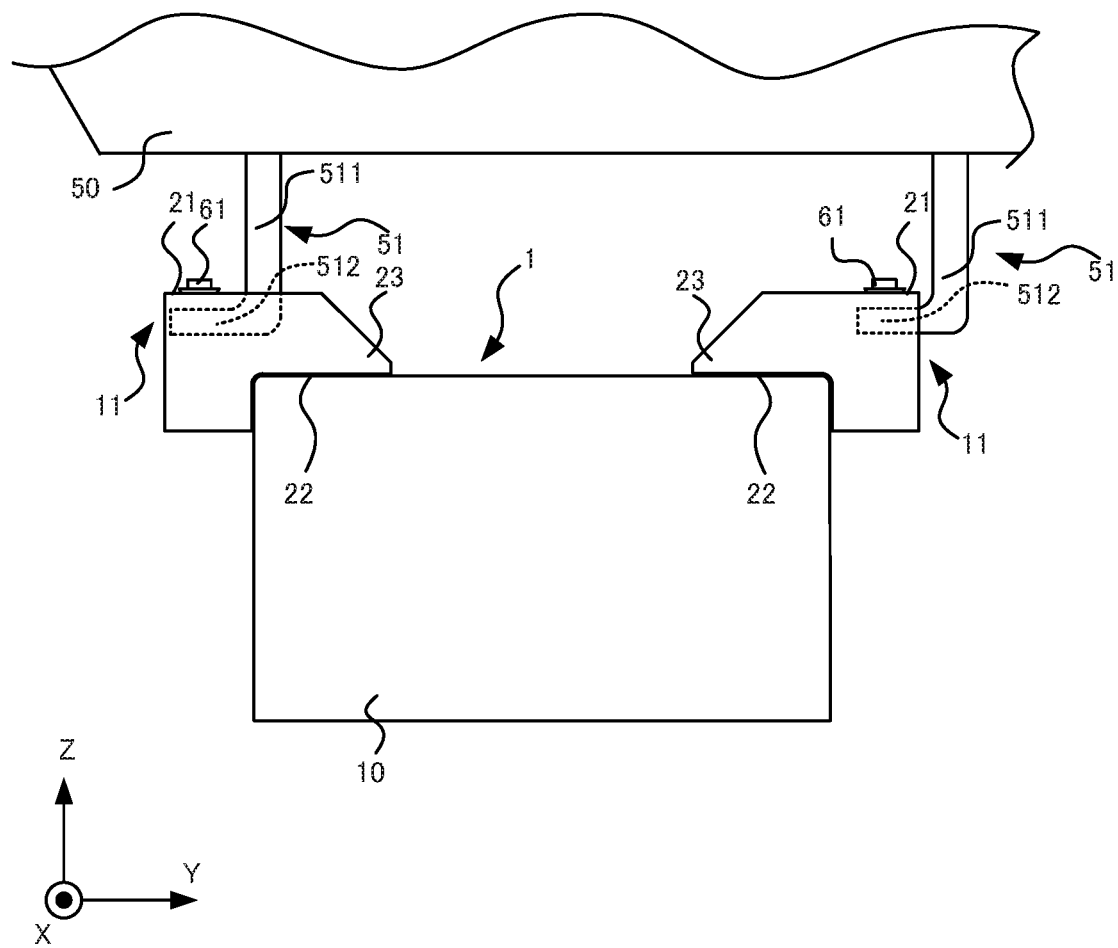
FIG. 11 is a side view of the underfloor device for railway vehicles according to an embodiment.

The locking members 11 may be attached to the casing 10 so as to be disposed along both of the two edges of the casing 10 opposed in the attachment and removal direction of the underfloor device 1. FIG. 11 is a side view of the underfloor device for railway vehicles according to an embodiment. A pair of the locking members 11 is opposed to each other across the Y-axis direction and is symmetrical with respect to an XZ-plane. Each of the locking members 11 engages the corresponding foot 512.

Figure 12:
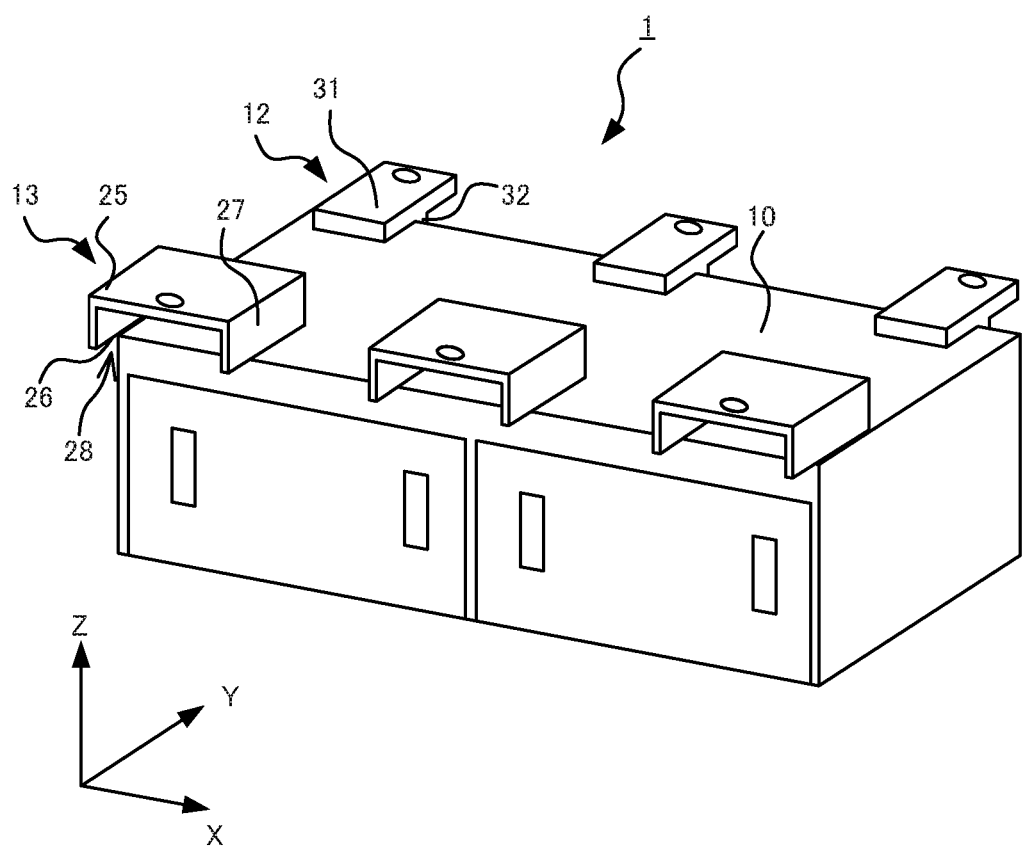
FIG. 12 is a perspective view of the underfloor device for railway vehicles according to an embodiment.
Figure 13:
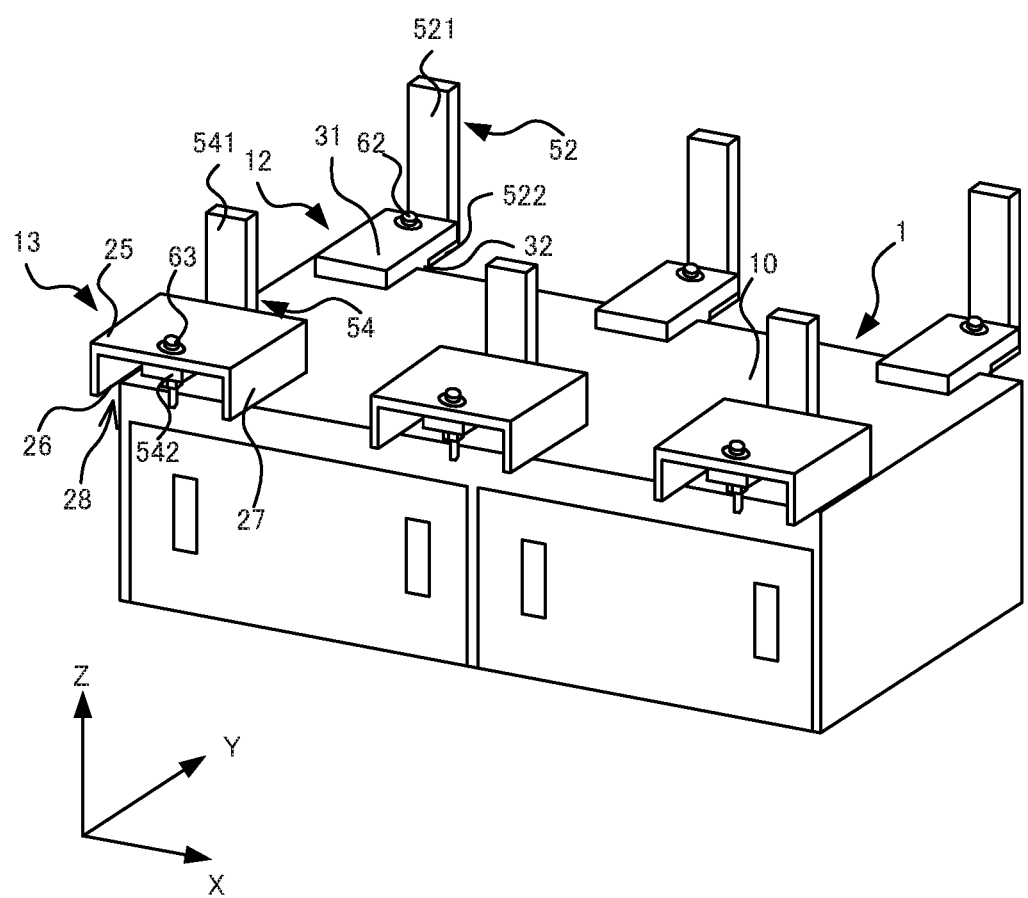
FIG. 13 illustrates an example of the attached underfloor device for railway vehicles according to the embodiment.

The underfloor device 1 may include a locking member 13 instead of the locking member 11. FIG. 12 is a perspective view of the underfloor device for railway vehicles according to an embodiment. FIG. 13 illustrates an example of the attached underfloor device for railway vehicles according to the embodiment. The locking member 13 engages a hanging tool 54 and is fastened with a fastening member 63. The hanging tool 54 includes a leg 541 having one end attached to the vehicle body 50 and extending vertically, and a foot 542 extending horizontally from the leg 541. The locking member 13 engages the foot 542, which is part of the hanging tool 54. In a manner similar to FIG. 2, the locking member 12 engages the hanging tool 52 and is fastened with the fastening member 62. The locking member 12 engages the foot 522, which is part of the hanging tool 52.

Figure 14:
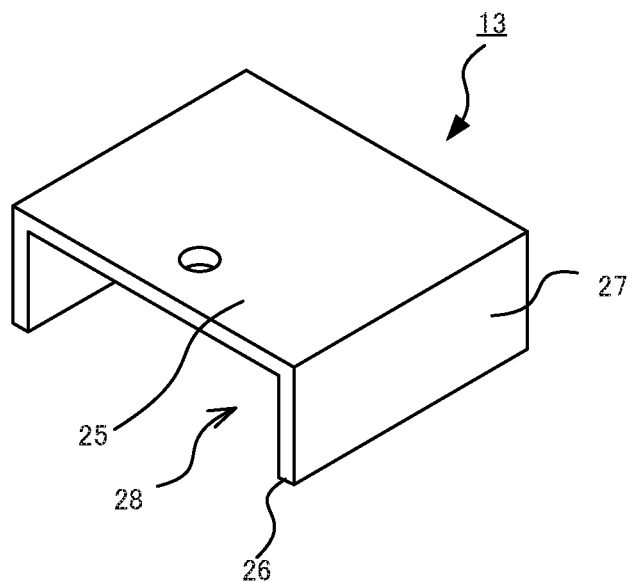
FIG. 14 is a perspective view of the locking member according to the embodiment.
Figure 15:
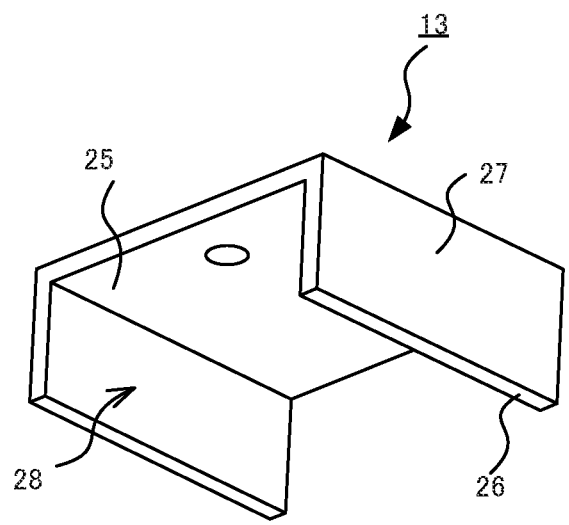
FIG. 15 is a perspective view of the locking member according to the embodiment.

FIGS. 14 and 15 are perspective views of the locking member according to the embodiment. FIG. 14 is a perspective view from above, and FIG. 15 is a perspective view from below. The locking member 13 is a hollow locking member that includes a locking part 25 to contact and engage a vertically upper face of the foot 542, a mount part 26 attached to the casing 10, and a connection part 27 connecting the locking part 25 and the mount part 26. The locking member 13 includes a space surrounded by the locking part 25, the mount part 26, and the connection part 27. In the embodiment, the space is a space passing through the hollow locking member in the attachment and removal direction of the underfloor device 1. The locking part 25 is disposed at a position spaced apart from the casing 10 horizontally and vertically upward. The locking part 25 contacts and engages the vertically upper face of the foot 542, which is inserted into the space surrounded by the locking part 25, the mount part 26, and the connection part 27. A void 28 having a vertical length greater than or equal to a threshold value is disposed vertically under the locking part 25. The threshold value is determined on the basis of the space needed for the work of fastening the locking member 13 to the hanging tool 54. The locking part 25 is disposed at a position spaced apart from the casing 10 horizontally and vertically upward, and the void 28 is disposed vertically under the locking part 25. Thus, there is no need to secure a space vertically over the casing 10 for the work of attaching the underfloor device 1. Therefore, no limitation is imposed on the dimensions of the underfloor device 1.

Figure 16:
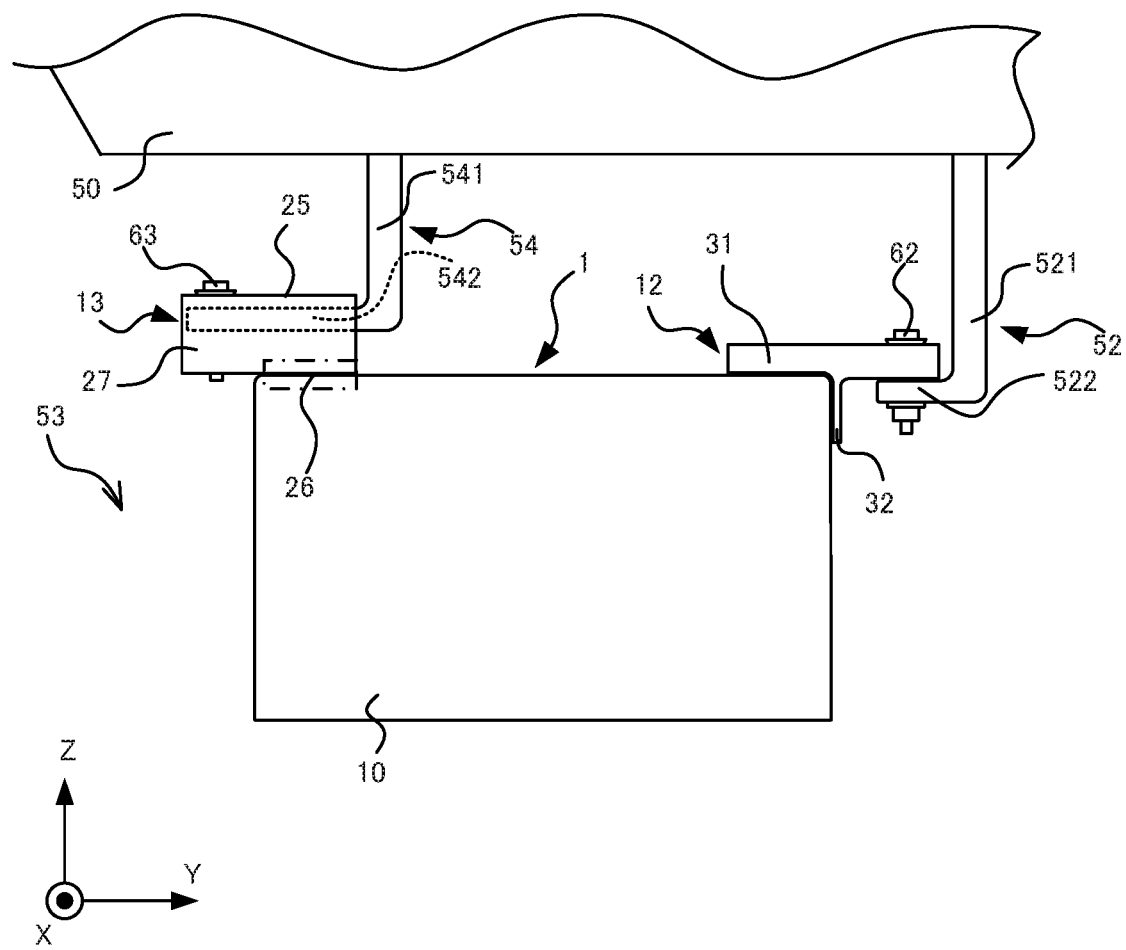
FIG. 16 is a side view of the underfloor device for railway vehicles according to the embodiment.
Figure 17:
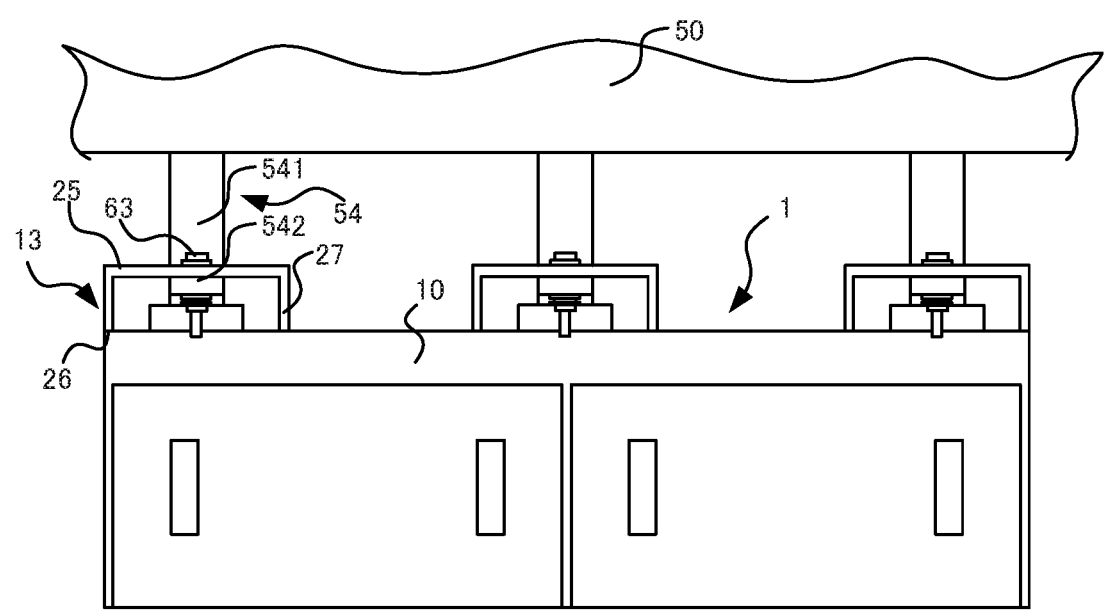
FIG. 17 is a front view of the underfloor device for railway vehicles according to the embodiment.
Figure 17:
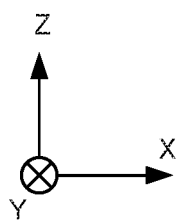

FIG. 16 is a side view of the underfloor device for railway vehicles according to the embodiment. FIG. 17 is a front view of the underfloor device for railway vehicles according to the embodiment. The hanging tools 52 and 54 are attached to the vehicle body 50. The hanging tool 54 is shorter than the hanging tool 52 in vertical length. The underfloor device 1 is attachable to and removable from the attachment opening 53 under the vehicle floor. In the embodiment, the underfloor device 1 is attached to and removed from the attachment opening 53, which is on a lateral side of the underfloor space of the vehicle. In the embodiment, the locking members 12, 13 are attached to a vertically upper face of the casing 10. The locking members 12, 13 are disposed at predetermined intervals along the two edges of the casing 10 opposed in the attachment and removal direction of the underfloor device 1. The interval between the locking members 12 and the interval between the locking members 13 are determined on the basis of factors including the weight of the underfloor device 1, the strength of the locking members 12, 13, and the strength of the hanging tools 52, 54. In a manner similar to that illustrated in FIG. 11, the locking members 13 may be attached to the casing 10 so as to be disposed along both of the two edges of the casing 10 across the attachment and removal direction of the underfloor device 1. The mount part 26 of the locking member 13 abuts on the vertically upper face of the casing 10, and is attached to the casing 10 by means of fastening with a fastening member, welding, or the like provided within a region indicated by a dashed-dotted line in FIG. 16.

As illustrated in FIGS. 8 to 10, in the case of the underfloor device 1 including the locking members 12, 13, the underfloor device 1 may be moved along the attachment and removal direction and along the vertical direction only of the underfloor device 1. Thus, the work of attaching the underfloor device 1 is easier than lifting the device vertically and then moving the device in a direction orthogonal to the traveling direction of the lifter.

As described above, in the underfloor device 1 according to an embodiment of the present disclosure, the locking part 21 included in the locking member 11, which is a hollow locking member, is disposed at a position spaced apart from the casing 10 horizontally and vertically upward, and the locking part 21 contacts and engages a vertically upper face of the foot 512, which is part of the hanging tool 51 inserted into the space in the locking member 11. As a result, the work of attaching the underfloor device 1 can be easily performed without imposing a limitation on the dimensions of the underfloor device 1. Likewise, inclusion of the locking member 13 in the underfloor device 1 makes the work of attaching the underfloor device 1 easier without imposing a limitation on the dimensions of the underfloor device 1.

The present disclosure is not limited to the foregoing embodiments. The shapes of the locking members 11, 12, 13 are not limited to those described above.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Underfloor device for railway vehicles
10 Casing
11, 12, 13 Locking member
21, 25 Locking part
22, 26 Mount part
23, 27 Connection part
24, 28 Void
31 Horizontal member
32 Vertical member
50 Vehicle body
51, 52, 54 Hanging tool
53 Attachment opening
61, 62, 63 Fastening member
71 Platform
511, 521, 541 Leg
512, 522, 542 Foot

The invention claimed is:

1. An underfloor device, for a railway vehicle, that is attachable to and removable from an attachment opening under a floor of the vehicle and is attached to the vehicle by being supported by hanging tools disposed under the floor of the vehicle, the underfloor device comprising:
   a casing; and
   locking members attached to the casing, each of the locking members engaging a corresponding hanging tool of the hanging tools,
   wherein at least one of the locking members is a hollow locking member comprising:
      a locking part to contact and engage a vertically upper face of part of the hanging tool;
      a mount part attached to the casing; and
      connection parts spaced apart from each other and connecting respective opposite ends of the locking part and the mount part,
   wherein a space surrounded by the locking part, the mount part, and the connection parts is formed,
   wherein the locking part is disposed at a position spaced apart from the casing horizontally and vertically upward, and
   wherein the locking part is to contact and engage the vertically upper face of part of the hanging tool inserted into the space.

2. The underfloor device according to claim 1, wherein a void is disposed vertically under the locking part.

3. The underfloor device according to claim 2, wherein the space in the hollow locking member is a space passing through the hollow locking member in an attachment and removal direction of the underfloor device.

4. The underfloor device according to claim 3, wherein
   the locking members are attached to the vertically upper face of the casing at predetermined intervals along two edges of the casing opposed in an attachment and removal direction of the underfloor device, and
   the locking members attached to the casing along at least one edge of the two edges are the hollow locking members.

5. The underfloor device according to claim 4, wherein
   the locking members attached to the casing along one edge of the two edges are the hollow locking members, the one edge being closer to the attachment opening in a state where the underfloor device is installed in the vehicle,
   the locking members attached to the casing along another edge of the two edges each comprise:
      a horizontal member extending horizontally; and
      a vertical member extending vertically downward from the horizontal member,
   one end of the horizontal member contacts and engages the vertically upper face of part of the hanging tool, and
   another end of the horizontal member and the vertical member are attached to the casing.

6. The underfloor device according to claim 4, wherein the locking members attached to the casing along the two edges are the hollow locking members.

7. The underfloor device according to claim 2, wherein
   the locking members are attached to the vertically upper face of the casing at predetermined intervals along two edges of the casing opposed in an attachment and removal direction of the underfloor device, and
   the locking members attached to the casing along at least one edge of the two edges are the hollow locking members.

8. The underfloor device according to claim 7, wherein the locking members attached to the casing along the two edges are the hollow locking members.

9. The underfloor device according to claim 1, wherein the space in the hollow locking member is a space passing through the hollow locking member in an attachment and removal direction of the underfloor device.

10. The underfloor device according to claim 9, wherein
   the locking members are attached to the vertically upper face of the casing at predetermined intervals along two edges of the casing opposed in an attachment and removal direction of the underfloor device, and
   the locking members attached to the casing along at least one edge of the two edges are the hollow locking members.

11. The underfloor device according to claim 10, wherein
the locking members attached to the casing along one edge of the two edges are the hollow locking members, the one edge being closer to the attachment opening in a state where the underfloor device is installed in the vehicle,
the locking members attached to the casing along another edge of the two edges each comprise:
a horizontal member extending horizontally; and
a vertical member extending vertically downward from the horizontal member,
one end of the horizontal member contacts and engages the vertically upper face of part of the hanging tool, and
another end of the horizontal member and the vertical member are attached to the casing.

12. The underfloor device according to claim 10, wherein the locking members attached to the casing along the two edges are the hollow locking members.

13. The underfloor device according to claim 1, wherein
the locking members are attached to the vertically upper face of the casing at predetermined intervals along two edges of the casing opposed in an attachment and removal direction of the underfloor device, and
the locking members attached to the casing along at least one edge of the two edges are the hollow locking members.

14. The underfloor device according to claim 13, wherein the locking members attached to the casing along the two edges are the hollow locking members.

15. An underfloor device, for a railway vehicle, that is attachable to and removable from an attachment opening under a floor of the vehicle and is attached to the vehicle by being supported by hanging tools disposed under the floor of the vehicle, the underfloor device comprising:
a casing; and
locking members attached to the casing, each of the locking members engaging a corresponding hanging tool of the hanging tools,
wherein at least one of the locking members is a hollow locking member comprising:
a locking part to contact and engage a vertically upper face of part of the hanging tool;
a mount part attached to the casing; and
a connection part that connects the locking part and the mount part,
wherein a space surrounded by the locking part, the mount part, and the connection part is formed,
wherein the locking part is disposed at a position spaced apart from the casing horizontally and vertically upward, and
wherein the locking part is to contact and engage the vertically upper face of part of the hanging tool inserted into the space, wherein
the locking members are attached to the vertically upper face of the casing at predetermined intervals along two edges of the casing opposed in an attachment and removal direction of the underfloor device, and
the locking members attached to the casing along at least one edge of the two edges are the hollow locking members, wherein
the locking members attached to the casing along one edge of the two edges are the hollow locking members, the one edge being closer to the attachment opening in a state where the underfloor device is installed in the vehicle,
the locking members attached to the casing along another edge of the two edges each comprise:
a horizontal member extending horizontally; and
a vertical member extending vertically downward from the horizontal member,
one end of the horizontal member contacts and engages the vertically upper face of part of the hanging tool, and
another end of the horizontal member and the vertical member are attached to the casing.

16. An underfloor device, for a railway vehicle, that is attachable to and removable from an attachment opening under a floor of the vehicle and is attached to the vehicle by being supported by hanging tools disposed under the floor of the vehicle, the underfloor device comprising:
a casing; and
locking members attached to the casing, each of the locking members engaging a corresponding hanging tool of the hanging tools,
wherein at least one of the locking members is a hollow locking member comprising:
a locking part to contact and engage a vertically upper face of part of the hanging tool;
a mount part attached to the casing; and
a connection part that connects the locking part and the mount part,
wherein a space surrounded by the locking part, the mount part, and the connection part is formed,
wherein the locking part is disposed at a position spaced apart from the casing horizontally and vertically upward, and
wherein the locking part is to contact and engage the vertically upper face of part of the hanging tool inserted into the space, wherein
a void is disposed vertically under the locking part, wherein
the locking members are attached to the vertically upper face of the casing at predetermined intervals along two edges of the casing opposed in an attachment and removal direction of the underfloor device, and
the locking members attached to the casing along at least one edge of the two edges are the hollow locking members, wherein
the locking members attached to the casing along one edge of the two edges are the hollow locking members, the one edge being closer to the attachment opening in a state where the underfloor device is installed in the vehicle,
the locking members attached to the casing along another edge of the two edges each comprise:
a horizontal member extending horizontally; and
a vertical member extending vertically downward from the horizontal member,
one end of the horizontal member contacts and engages the vertically upper face of part of the hanging tool, and
another end of the horizontal member and the vertical member are attached to the casing.

* * * * *